(12) United States Patent
McCann (10) Patent No.: US 9,974,038 B2
(45) Date of Patent: May 15, 2018

(54) CIRCUITS AND OPERATING METHODS THEREOF FOR CORRECTING PHASE ERRORS CAUSED BY GALLIUM NITRIDE DEVICES

(71) Applicant: MACOM Technology Solutions Holdings, Inc., Lowell, MA (US)

(72) Inventor: Damian McCann, Rossmoor, CA (US)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 0 days. days.

(21) Appl. No.: 15/198,283

(22) Filed: Jun. 30, 2016

(65) Prior Publication Data

US 2018/0007650 A1    Jan. 4, 2018

(51) Int. Cl.
*H04W 56/00* (2009.01)
*H03F 1/02* (2006.01)
*H03F 3/193* (2006.01)

(52) U.S. Cl.
CPC ...... *H04W 56/0035* (2013.01); *H03F 1/0233* (2013.01); *H03F 3/193* (2013.01); *H03F 2200/102* (2013.01); *H03F 2200/165* (2013.01); *H03F 2200/339* (2013.01); *H03F 2200/451* (2013.01)

(58) Field of Classification Search
CPC ....... H04B 2001/0425; H04W 56/0035; H03F 1/0233; H03F 3/193; H03F 2200/102; H03F 2200/165; H03F 2200/339; H03F 2200/451; H03F 1/3247; H03F 1/3282; H03F 3/19
See application file for complete search history.

(56) References Cited

U.S. PATENT DOCUMENTS

| 5,742,201 | A | 4/1998 | Eisenberg et al. |
| 5,808,511 | A | 9/1998 | Kobayashi |
| 6,333,677 | B1 | 12/2001 | Dening |
| 6,385,436 | B1 | 5/2002 | Horiguchi et al. |
| 6,522,901 | B1 * | 2/2003 | Koitsalu ............ H03F 1/305 455/127.1 |

(Continued)

FOREIGN PATENT DOCUMENTS

| EP | 2 362 542 A2 | 8/2011 |
| EP | 2 475 094 A1 | 7/2012 |

(Continued)

OTHER PUBLICATIONS

Nat Bowers "Making more of Doherty in LTE Basestations", Nov. 28, 2014, pp. 1-6.*

(Continued)

*Primary Examiner* — Sophia Vlahos
(74) *Attorney, Agent, or Firm* — Wolf, Greenfield & Sacks, P.C.

(57) ABSTRACT

Circuits and operating methods thereof for correcting phase errors introduced by amplifiers employing gallium nitride (GaN) transistors are described. The phase errors are caused by trapping effects exhibited by the GaN transistors. The circuits described herein pre-distort the phase of the input signal to compensate for the phase error introduced by the amplifier. Thereby, the phase of the output signal of the amplifier has a reduced phase error. For example, the output signal may have a near zero (or zero) phase error.

18 Claims, 10 Drawing Sheets

(56) References Cited

U.S. PATENT DOCUMENTS

| | | | |
|---|---|---|---|
| 6,885,241 B2* | 4/2005 | Huang | H03F 1/3247 |
| | | | 330/149 |
| 6,980,116 B2 | 12/2005 | Hagen | |
| 7,113,035 B2* | 9/2006 | Koukkari | H03F 1/3247 |
| | | | 330/136 |
| 7,388,429 B2* | 6/2008 | Ui | H03F 1/3276 |
| | | | 257/E27.012 |
| 7,570,928 B2* | 8/2009 | Magoon | H03F 1/34 |
| | | | 375/300 |
| 8,224,266 B2* | 7/2012 | Liu | H03F 1/3247 |
| | | | 330/149 |
| 9,083,350 B1* | 7/2015 | Posner | H03F 1/3247 |
| 9,088,258 B2 | 7/2015 | Ichitsubo et al. | |
| 9,249,760 B2 | 2/2016 | Patterson et al. | |
| 9,559,732 B2* | 1/2017 | Shizawa | H04B 1/0475 |
| 2002/0182758 A1 | 12/2002 | Judkins | |
| 2004/0189381 A1* | 9/2004 | Louis | H03F 1/0266 |
| | | | 330/124 R |
| 2006/0108660 A1 | 5/2006 | Ui | |
| 2012/0157020 A1* | 6/2012 | Sasaki | H03F 1/0233 |
| | | | 455/127.1 |
| 2015/0054582 A1* | 2/2015 | Goss | H03F 1/3247 |
| | | | 330/279 |
| 2015/0070092 A1 | 3/2015 | Ishimoto et al. | |
| 2015/0116039 A1* | 4/2015 | Ahmed | H03F 1/0233 |
| | | | 330/295 |
| 2016/0065146 A1 | 3/2016 | Zhu | |
| 2016/0094187 A1 | 3/2016 | Staudinger et al. | |
| 2016/0294328 A1 | 10/2016 | Kondo et al. | |
| 2016/0334506 A1* | 11/2016 | Tua | G01S 7/4008 |
| 2017/0033748 A1 | 2/2017 | Rajendran et al. | |
| 2017/0170789 A1 | 6/2017 | Sasaki | |

FOREIGN PATENT DOCUMENTS

| | | |
|---|---|---|
| EP | 2 582 043 A1 | 4/2013 |
| JP | 2016-010132 A | 1/2016 |
| WO | WO 2012/097085 A1 | 7/2012 |
| WO | WO 2016/032800 A1 | 3/2016 |

OTHER PUBLICATIONS

Koyama et al. "Implications of Using kW-level GaN Transistors in Radar and Avionic Systems", Dec. 21, 2015, Microwaves, Communications, Antennas and Electronic Systems (COMCAS), 2015 IEEE pp. 1-5.*
U.S. Appl. No. 15/438,971, filed Feb. 22, 2017, Leckey.
International Search Report and Written Opinion for Application No. PCT/US2017/039626 dated Sep. 25, 2017.

* cited by examiner

CIRCUITS AND OPERATING METHODS THEREOF FOR CORRECTING PHASE ERRORS CAUSED BY GALLIUM NITRIDE DEVICES

BACKGROUND

Technical Field

The technology relates to circuits to correct phase errors introduced by, for example, gallium nitride (GaN) devices in communication systems.

Discussion of the Related Art

GaN semiconductor material has received appreciable attention in recent years because of its desirable electronic and electro-optical properties. GaN has a wide, direct bandgap of about 3.4 eV. Because of its wide bandgap, GaN is more resistant to avalanche breakdown and has a higher intrinsic field strength compared to more common semiconductor materials, such as silicon and gallium arsenide. In addition, GaN is able to maintain its electrical performance at higher temperatures as compared to other semiconductors, such as silicon or gallium arsenide. GaN also has a higher carrier saturation velocity compared to silicon. Additionally, GaN has a Wurtzite crystal structure, is a hard material, has a high thermal conductivity, and has a much higher melting point than other conventional semiconductors such as silicon, germanium, and gallium arsenide. Accordingly, GaN is useful for high-speed, high-voltage, and high-power applications. For example, GaN materials may be used as active circuit components in semiconductor amplifiers for radio-frequency (RF) communications.

SUMMARY

According to at least one aspect, a communication system is provided. The communication system includes a phase adjustment circuit configured to receive a first signal and generate a second signal by adjusting a phase of the first signal to compensate for a phase error to be introduced by a gallium nitride (GaN) transistor, an amplification circuit including the GaN transistor and being configured to receive the second signal, amplify the second signal to generate a third signal by applying the second signal to the GaN transistor, and provide the third signal to an antenna for wireless transmission, an envelope detector configured to receive the third signal and detect an envelope of the third signal, and a controller configured to receive the envelope of the third signal from the envelope detector and provide a control signal to the phase adjustment circuit based on the envelope of the third signal.

In some embodiments, the phase adjustment circuit is further configured to compensate for a phase error introduced by trapping effects in the GaN transistor. In some embodiments, the amplification circuit includes a second transistor coupled in series with the GaN transistor and a GaN sequencer coupled to the GaN transistor and the second transistor and configured to sequence the GaN transistor by applying a bias voltage to the GaN transistor before turning on the second transistor. In some embodiments, the amplification circuit includes a power splitter configured to receive the second signal and provide a first output signal and a second output signal, a first amplifier configured to receive the first output signal and generate a first amplified signal, a second amplifier configured to receive the second output signal and generate a second amplified signal, and a power combiner configured to receive the first amplified signal and the second amplified signal and generate the third signal.

In some embodiments, the phase adjustment circuit includes a coupler having a first port to receive the first signal, a second port to provide the second signal, a third port, and a fourth port. In these embodiments, the phase adjustment circuit may further include a first variable capacitance diode coupled between the third port and a reference potential, a second variable capacitance diode coupled between the fourth port and the reference potential, and an RC filter coupled to a cathode of the first variable capacitance diode and a cathode of the second variable capacitance diode. In some examples, the RC filter is a tunable RC filter and the controller is further configured to tune the RC filter based on the envelope of the third signal. In some examples, the phase adjustment circuit further includes a first inductance coupled between the cathode of the first variable capacitance diode and the RC filter and a second inductance coupled between the cathode of the second variable capacitance diode and the RC filter. In some examples, the phase adjustment circuit further includes a first capacitance coupled between the cathode of the first variable capacitance diode and the third port and a second capacitance coupled between the cathode of the second variable capacitance diode and the fourth port.

In some embodiments, the phase adjustment circuit includes at least one variable resistance and the controller is further configured to adjust a resistance of the at least one variable resistance based on the envelope of the third signal. In some embodiments, the control signal includes a pulse and an amplitude of the pulse controls a magnitude of the phase shift introduced by the phase adjustment circuit. In some embodiments, the communication system further includes a modulator configured to receive a baseband signal and a carrier signal and generate the first signal by modulating the carrier signal based on the baseband signal.

According to at least one aspect, a method of wirelessly transmitting a signal is provided. The method includes receiving an input signal, adjusting a phase of the input signal by a phase adjustment amount to generate a phase adjusted signal and compensate for a phase error to be introduced by a gallium nitride (GaN) transistor, amplifying the phase adjusted signal to generate an amplified signal including applying the phase adjusted input signal to the GaN transistor, detecting an envelope of the amplified signal, tuning the phase adjustment amount based on the envelope of the amplified signal, and wirelessly transmitting the amplified signal.

In some embodiments, adjusting the phase of the input signal includes adjusting the phase of the input signal to compensate for a phase error introduced by trapping effects in the GaN transistor. In some embodiments, adjusting the phase of the input signal includes applying the input signal to a phase adjustment circuit and applying a control signal to the phase adjustment circuit. In some embodiments, tuning the phase adjustment amount includes changing an amplitude of the control signal. In some embodiments, tuning the phase adjustment amount includes changing a resistance of at least one variable resistance in the phase adjustment circuit. In some embodiments, tuning the phase adjustment amount includes identifying a phase of the amplified signal based on the envelope of the amplified signal and tuning the phase adjustment amount based on the identified phase of the amplified signal.

The foregoing apparatus and method embodiments may be included in any suitable combination with aspects, features, and acts described above or in further detail below. These and other aspects, embodiments, and features of the present teachings can be more fully understood from the following description in conjunction with the accompanying drawings.

BRIEF DESCRIPTION OF THE DRAWINGS

The skilled artisan will understand that the figures, described herein, are for illustration purposes only. It is to be understood that in some instances various aspects of the embodiments may be shown exaggerated or enlarged to facilitate an understanding of the embodiments. The drawings are not necessarily to scale, emphasis instead being placed upon illustrating the principles of the teachings. In the drawings, like reference characters generally refer to like features, functionally similar and/or structurally similar elements throughout the various figures. A depicted device or circuit may be integrated within a larger circuit.

When referring to the drawings in the following detailed description, spatial references "top," "bottom," "upper," "lower," "vertical," "horizontal," and the like may be used. Such references are used for teaching purposes, and are not intended as absolute references for embodied devices. The terms "on" and "over" are used for ease of explanation relative to the illustrations, and are not intended as absolute directional references. An embodied device may be oriented spatially in any suitable manner that may be different from the orientations shown in the drawings. The drawings are not intended to limit the scope of the present teachings in any way.

Features and advantages of the illustrated embodiments will become more apparent from the detailed description set forth below when taken in conjunction with the drawings.

DETAILED DESCRIPTION

As described above, transistors comprising gallium nitride (GaN) material are useful for high-speed, high-voltage, and high-power applications because of the favorable material properties of GaN. Some applications relating to RF communications can place demanding performance requirements on devices that include GaN transistors. For example, some applications may require high-power transistors capable of amplifying signals to power levels between approximately 50 Watts and approximately 400 Watts.

The favorable properties of GaN transistors also come with new limitations relative to silicon based transistors. For example, GaN transistors may exhibit more severe trapping effects than transistors constructed from other semiconductor materials such as silicon. Further, the trapping effects exhibited by a particular GaN transistor may be different than another GaN transistor with a similar construction. The trapping effects exhibited by the GaN transistors may cause signal distortion. For example, amplifiers in communication systems that are constructed from GaN transistors may introduce a phase error into the output signal caused by the trapping effects exhibited by these GaN transistors. Thereby, the performance of the communication system is degraded.

Figure 6:
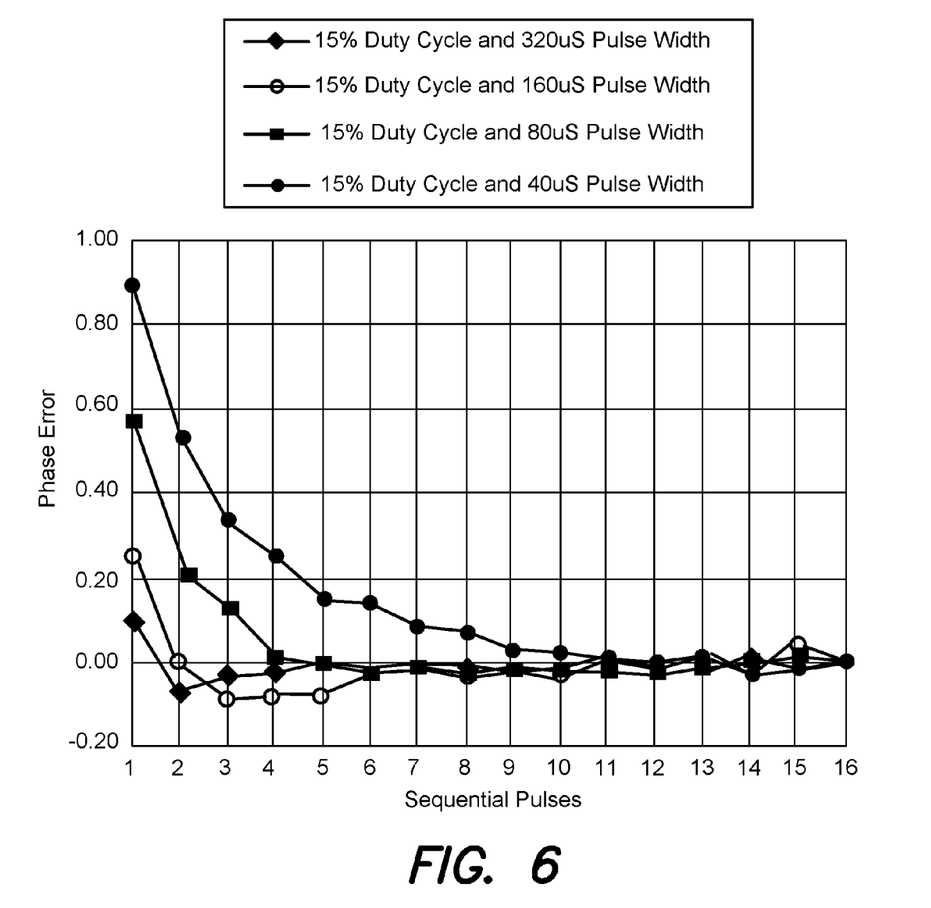
FIG. 6 is a graph showing the phase error introduced into a signal because of the trapping effects in a GaN transistor, according to some embodiments.

The phase error introduced by an amplifier employing GaN transistors is generally largest when a signal is initially applied to the amplifier and decays over time as the traps are filled. FIG. 6 is a graph illustrating the phase error introduced by an amplifier employing a GaN transistor. The graph shows the resulting phase error exhibited by a series of pulses with a 15% duty cycle and varying durations after passing through the amplifier. As shown, the phase error in the first five pulses applied to the amplifier is larger than the phase error in the remainder of the pulses applied to the amplifier. The pulses near the end of the pulse train have very little (if any) phase error. Further, the phase error in the output pulses varies based on the duration of the pulse. As shown, the pulse train with a 320 microsecond (uS) pulse width exhibits the least amount of phase error while the pulse train with a shorter 40 microsecond (uS) pulse width exhibits the most amount of phase error. Thereby, the trapping effects exhibited by the amplifier change over time as the traps are filled and are dependent upon the particular waveform being applied to the amplifier.

The inventors have conceived and developed various circuits and operating methods thereof to correct the phase error introduced by the trapping effects of a GaN transistor. In some embodiments, the signal provided to an amplifier including a GaN transistor is pre-distorted to account for the phase error that is subsequently introduced by the GaN transistor. The phase adjustment introduced to the input signal of the amplifier is dynamic and decays over time in a similar fashion to the phase error decaying over time as traps in the GaN transistor are filled. Thereby, the output signal of the amplifier has a reduced phase error. For example, the output signal may have a near zero (or zero) phase error.

Figure 1:
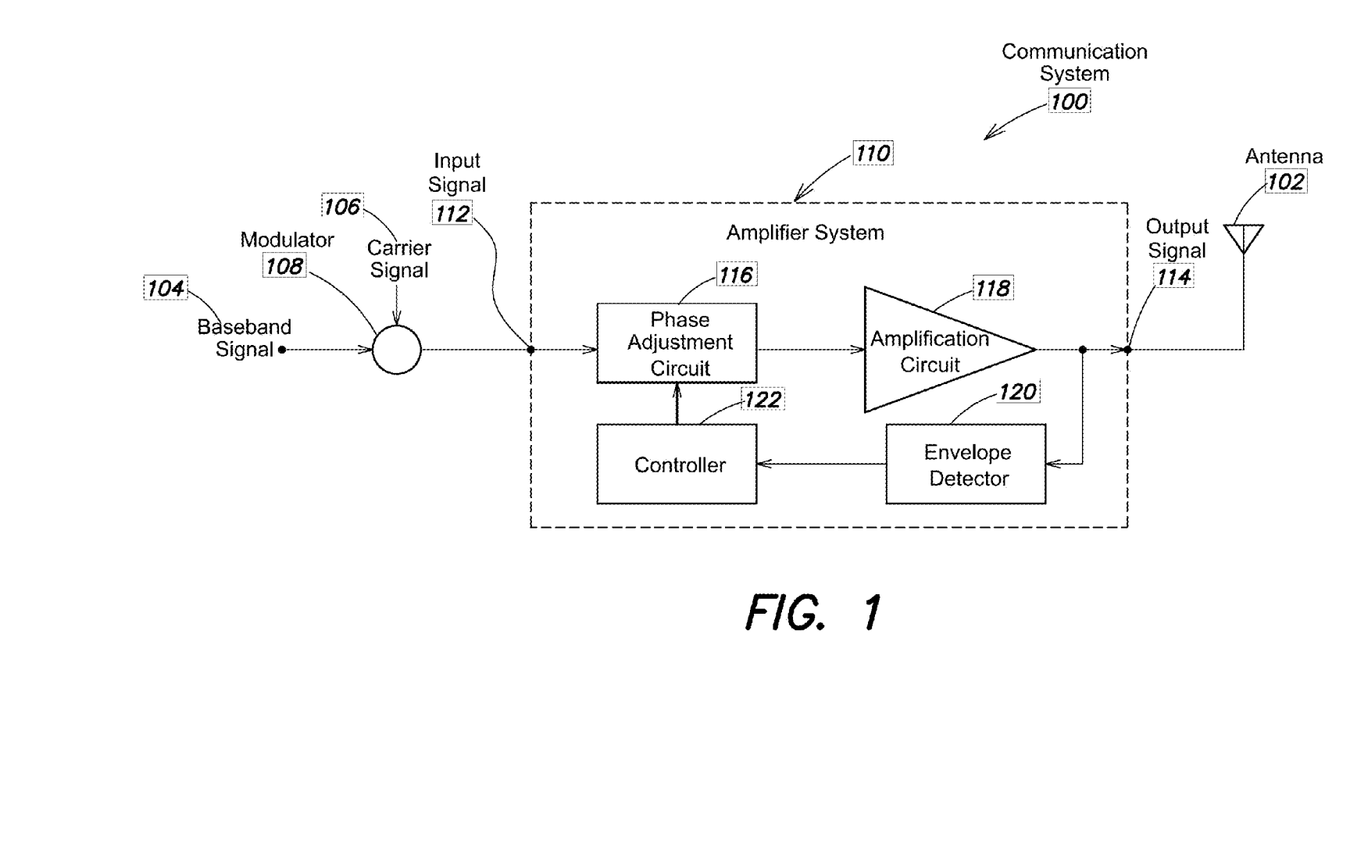
FIG. 1 shows an example communication system, according to some embodiments.

FIG. 1 shows an example communication system 100 constructed to compensate for trapping effects. The communication system 100 receives a baseband 104 and transmits a wireless signal via an antenna 102. The communication system 100 includes a modulator 108 that receives a carrier signal 106 in addition to the baseband signal 104 and modulates the carrier signal 106 based on the baseband signal 104. The modulator 108 provides a modulated signal to an amplifier system 110 that amplifies the modulated signal and provides an amplified signal to the antenna 102.

The amplifier system 110 receives the modulated signal from the modulator 108 as the input signal 112 and amplifies the input signal 112 to generate the output signal 114. As shown in FIG. 1, the amplifier system 110 includes a phase adjustment circuit 116 coupled to an amplification circuit 118 and a controller 122. The amplification circuit 118 may include one or more GaN transistors exhibiting trapping effects that cause a phase error in the output signal 114 if not corrected. The phase adjustment circuit 116 pre-distorts the phase of the input signal 112 to compensate for the phase error introduced by the amplification circuit 118 such that the output signal 114 has a reduced phase error. For example, the output signal 114 may have a phase error below 0.5 degrees. The controller 122 may control the phase adjustment provided by the phase adjustment circuit 116 to appropriately compensate for the trapping effects exhibited by the GaN transistor(s) in the amplification circuit 118. The controller 122 may be a microcontroller, processor, or other suitable processing device.

The amplifier system 110 further includes an envelope detector 120 coupled between the amplification circuit 118 and the controller 122. The envelope detector 120 identifies an envelope of the output signal 114 and provides the envelope to the controller 122. The controller 122 may fine-tune the phase adjustment circuit 116 to reduce the phase error exhibited by the output signal 114 based on the envelope from the envelope detector 120. For example, the controller 122 may extract relevant signal information (e.g., phase information) from the envelope generated by the envelope detector 120 and tune the phase adjustment provided by the phase adjustment circuit 116 based on the extracted signal information.

Figure 2:
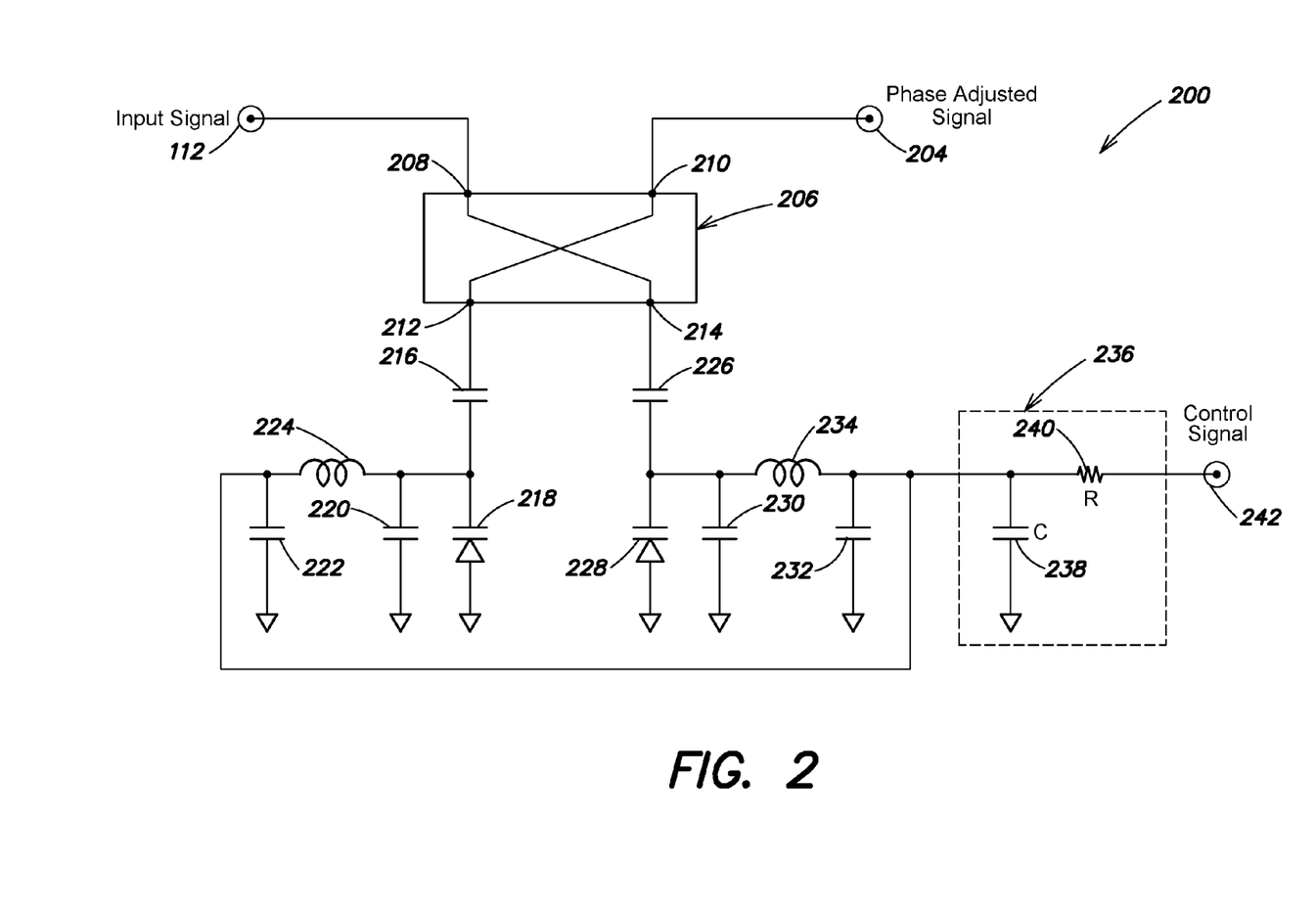
FIG. 2 shows an example phase adjustment circuit, according to some embodiments.

As discussed above, the phase adjustment circuit 116 may adjust a phase of the input signal 112 to compensate for the phase error introduced by GaN transistors in the amplification circuit 110. An example of such a phase adjustment circuit is shown in FIG. 2 as phase adjustment circuit 200. Phase adjustment circuit 200 includes a coupler 206 that receives the input signal 112 at a first port 208 and provides a phase adjusted signal 204 at a second port 210. The coupler 206 further includes a third port 212 coupled to a first terminal of a capacitance 216. The capacitance 216 has a second terminal coupled to a first terminal of an inductance 224, a first terminal of a capacitance 220, and a cathode of a variable capacitance diode 218. The inductance 224 includes a second terminal coupled to an RC filter 236 and a first terminal of a capacitance 222. A second terminal of the capacitance 220, a second terminal of the capacitance 222, and an anode of the variable capacitance diode 218 are coupled to a reference potential (e.g., ground).

As shown in FIG. 2, the coupler 206 also includes a fourth port 214 that is coupled to a first terminal of a capacitance 226. The capacitance 226 has a second terminal coupled to a first terminal of an inductance 234, a first terminal of a capacitance 230, and a cathode of a variable capacitance diode 228. The inductance 234 includes a second terminal coupled to an RC filter 236 and a first terminal of a capacitance 232. A second terminal of the capacitance 230, a second terminal of the capacitance 232, and an anode of the variable capacitance diode 228 are coupled to the reference potential.

Figure 7:
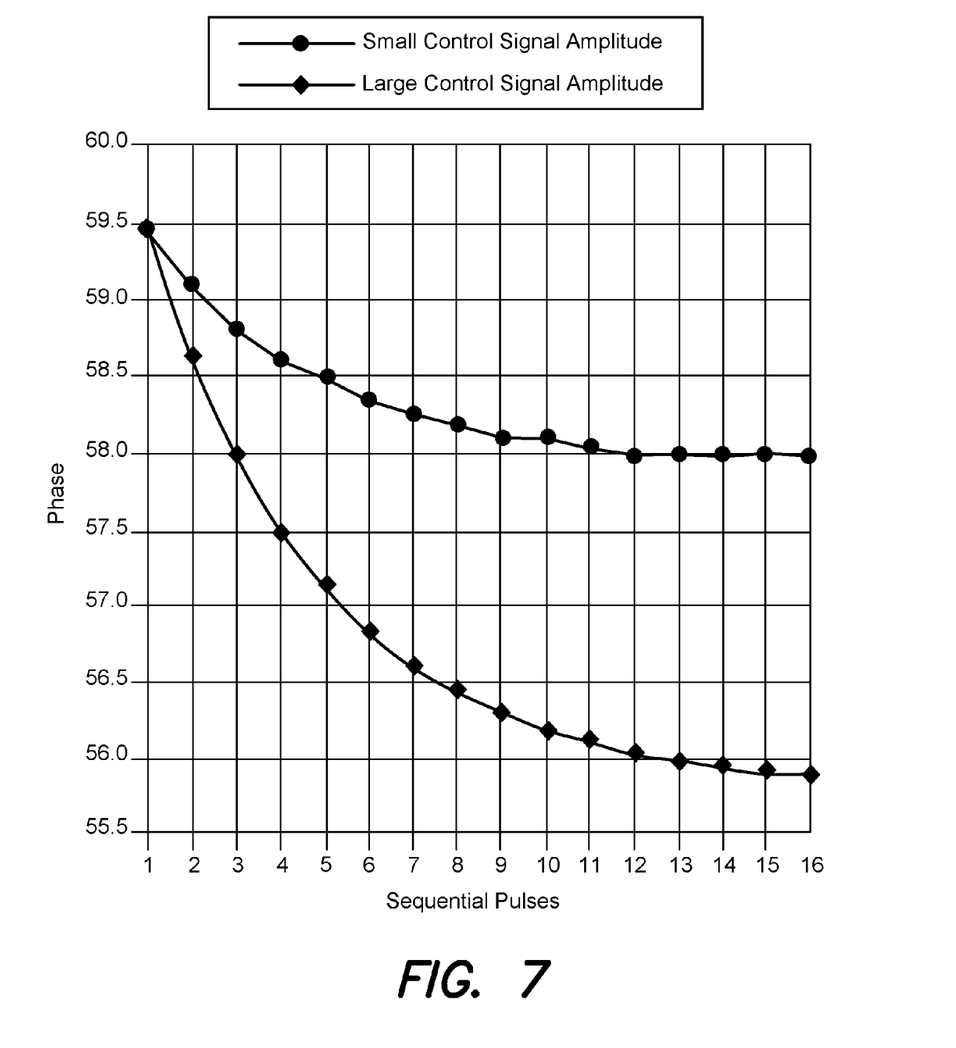
FIG. 7 is a graph showing the impact of changing an amplitude of a control signal provided to a phase adjustment circuit, according to some embodiments.

The RC filter 236 includes a resistance 240 coupled to a capacitance 238. As shown in FIG. 2, the resistance 240 and the capacitance 238 may be arranged so as to form a low-pass filter. The RC filter 236 receives the control signal 242 from, for example, the controller 122 shown in FIG. 1. As discussed above, the controller 122 may control various aspects of the phase adjustment introduced by the phase adjustment circuit 200. In some embodiments, the controller 122 may adjust an amplitude of the control signal 242 to control a magnitude of the phase adjustment introduced into the input signal 112 to generate the phase adjusted signal 204. FIG. 7 is a graph showing the phase of a sequence of pulses applied to the phase adjustment circuit 200 when the amplitude of the control signal 242 is varied. As shown, the difference in phase between the first pulse and the sixteenth pulse is smaller when the control signal 242 has a smaller amplitude. For example, the difference in phase between the first pulse and the sixteenth pulse is about 1.5 degrees for the small control signal amplitude while the difference in phase between the first pulse and the sixteenth pulse is about 3.5 degrees for the large control signal amplitude. Thereby, the controller 122 can adjust a magnitude of the phase adjustment introduced into the input signal 112 by the phase adjustment circuit 200.

Figure 8:
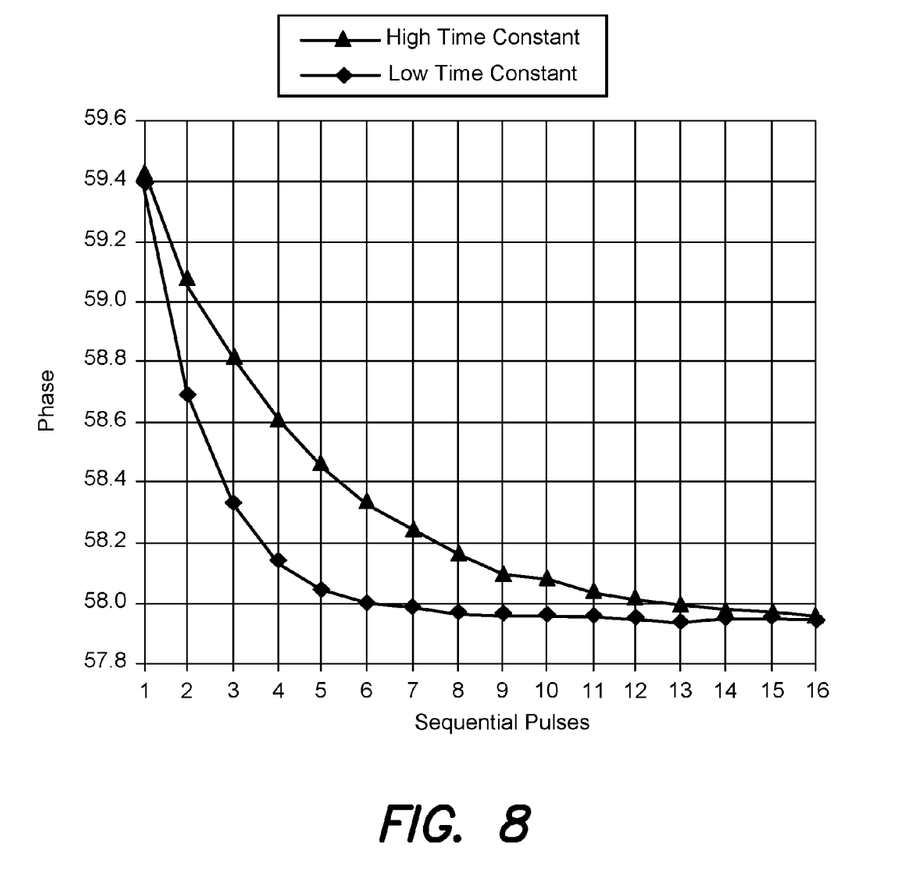
FIG. 8 is a graph showing the impact of changing a time constant of an RC filter in a phase adjustment circuit, according to some embodiments.

In some embodiments, the RC filter 236 may be a tunable RC filter. In these embodiments, the controller 122 may adjust the RC filter to adjust the rate at which the phase adjustment decays over time. Controlling the rate at which the phase adjustment decays may allow the controller 122 to better match the rate at which the phase error caused by the trapping effects of the GaN transistor decays as the traps are filled. For example, the RC filter may have a time constant equal to the resistance of the resistance 240 multiplied by the capacitance of the capacitance 238. Reducing the resistance of the resistance 240 reduces the time constant and, thereby, increases the steepness of the decaying phase shift over time. Conversely, increasing the resistance increases the time constant and, thereby, decreases the steepness of the decaying phase shift over time. FIG. 8 is a graph showing the change in phase applied to a train of pulses using RC filter 236 with different time constants. As shown, the 1.4 degree phase shift introduced by the phase adjustment circuit 200 decays faster when the RC filter 236 has a lower time constant. For example, the phase of the second pulse for the high time constant tuning is only about 0.3 degrees smaller than the phase of the first pulse. In contrast, the phase of the second pulse for the low time constant tuning is about 0.7 degrees smaller than the phase of the first pulse. Thereby, the controller 122 may change the rate at which the phase adjustment introduced by the phase adjustment circuit 200 decays over time by changing the time constant of the RC filter 236.

In some embodiments, the adjustments to the time constant of the RC filter 236 may be performed independently from changes to the amplitude of the control signal 242. Thereby, the controller 122 can better tune the phase adjustment applied to the input signal for the particular GaN transistor by controlling the magnitude of the phase shift independently from the shape of the phase shift.

Figure 3:
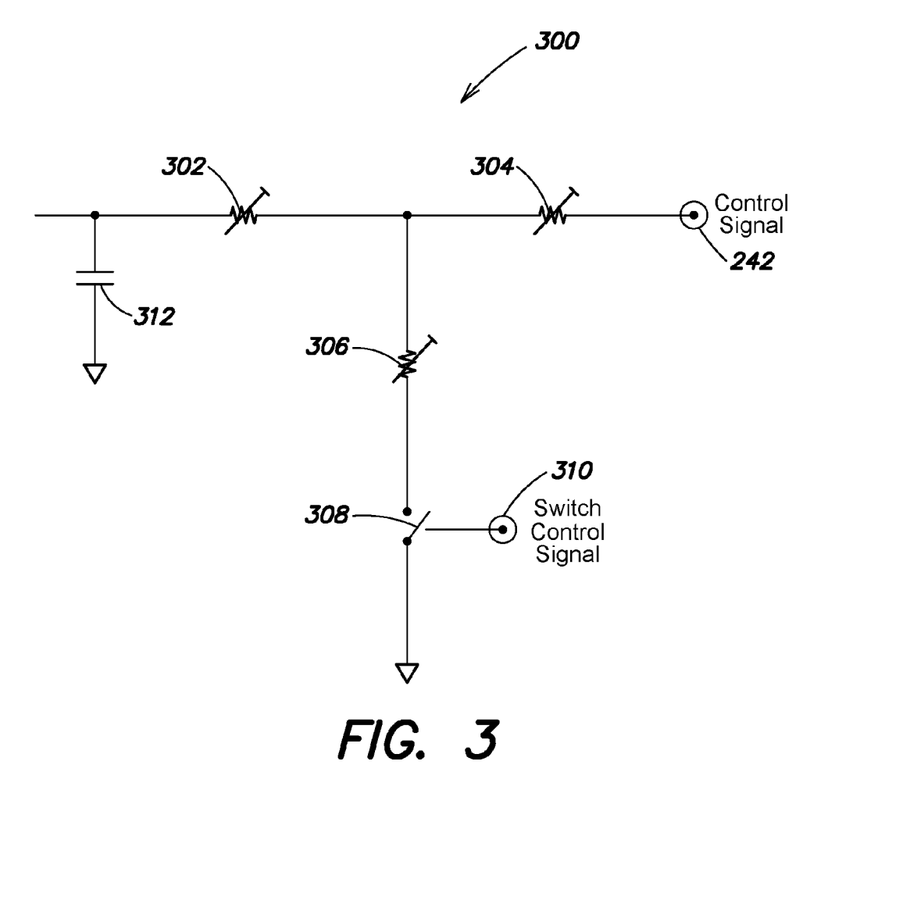
FIG. 3 shows an example tunable RC filter, according to some embodiments.

As discussed above, the RC filter 236 may be a tunable RC filter that is controlled by the controller 122. FIG. 3 shows such an example tunable RC filter 300. The tunable RC filter 300 includes variable resistances 302, 304, and 306 that may be adjusted to achieve an equivalent resistance value that yields a desired time constant. The tunable RC filter 300 also includes a switch 308 that is controlled by a switch control signal 310 which selectively couples variable resistance 306 to a reference potential (e.g., ground). The controller 122 may generate the switch control signal 310 to provide additional flexibility as to the possible range of equivalent resistance values, and thereby time constants, that the tunable RC filter 300 can achieve.

As shown in FIG. 3, the tunable RC filter 300 includes a capacitance 312 with a first terminal coupled to the reference potential and a second terminal coupled to a first terminal of the variable impendence 302. The variable resistance 302 has a second terminal coupled to a first terminal of the variable resistance 304 and a first terminal of the variable resistance 306. The switch 308 is coupled between the reference potential and a second terminal of the variable resistance 306.

Figure 4A:
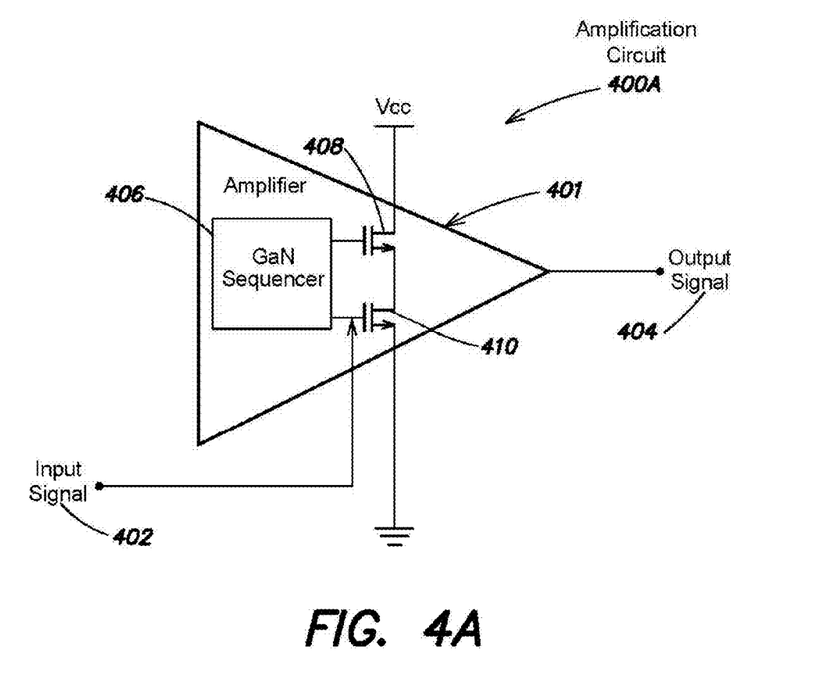
FIGS. 4A-4C each show an example amplification circuit employing gallium nitride (GaN) transistor(s), according to some embodiments.

As discussed above with reference to FIG. 1, the amplification circuit 118 may amplify the phase adjusted signal from the phase adjustment circuit 116 using one or more GaN transistors. Such an amplification circuit is shown in FIG. 4A by amplification circuit 400A. The amplification circuit 400A includes an amplifier 401 that receives an input signal 402 and provides an output signal 404. The amplifier 401 amplifies the input signal 402 to generate the output signal 404 by applying the input signal 402 to a GaN transistor 410. The GaN transistor 410 receives the input signal 402 at a gate terminal and provides the output signal 404 at a drain terminal. The source terminal of the GaN transistor 410 is coupled to a reference potential (e.g., ground). As discussed above, the GaN transistor 410 may exhibit trapping effects that shift a phase of the output signal 404. Thereby, the input signal 402 may be pre-distorted by the phase adjustment circuits described above to compensate for the phase shift introduced by the GaN transistor 410.

As shown in FIG. 4A, the amplifier 401 includes a transistor 408 coupled between the supply voltage Vcc and the GaN transistor 410. In particular, the transistor 408 has a drain terminal coupled to the supply voltage Vcc and a source terminal coupled to a drain terminal of the GaN transistor 410. The transistor 408 may be constructed from a semiconductor other than GaN such as silicon. For example, the transistor 408 may be a silicon metal-oxide-semiconductor field-effect transistor (MOSFET). The gate terminals of the GaN transistor 410 and the transistor 408 are coupled to a GaN sequencer 406 constructed to properly sequence the GaN transistor 410. For example, the GaN sequence 406 may be constructed to apply a bias voltage to the GaN transistor 410 before turning on the transistor 408 to avoid damaging the GaN transistor 410.

Figure 4B:
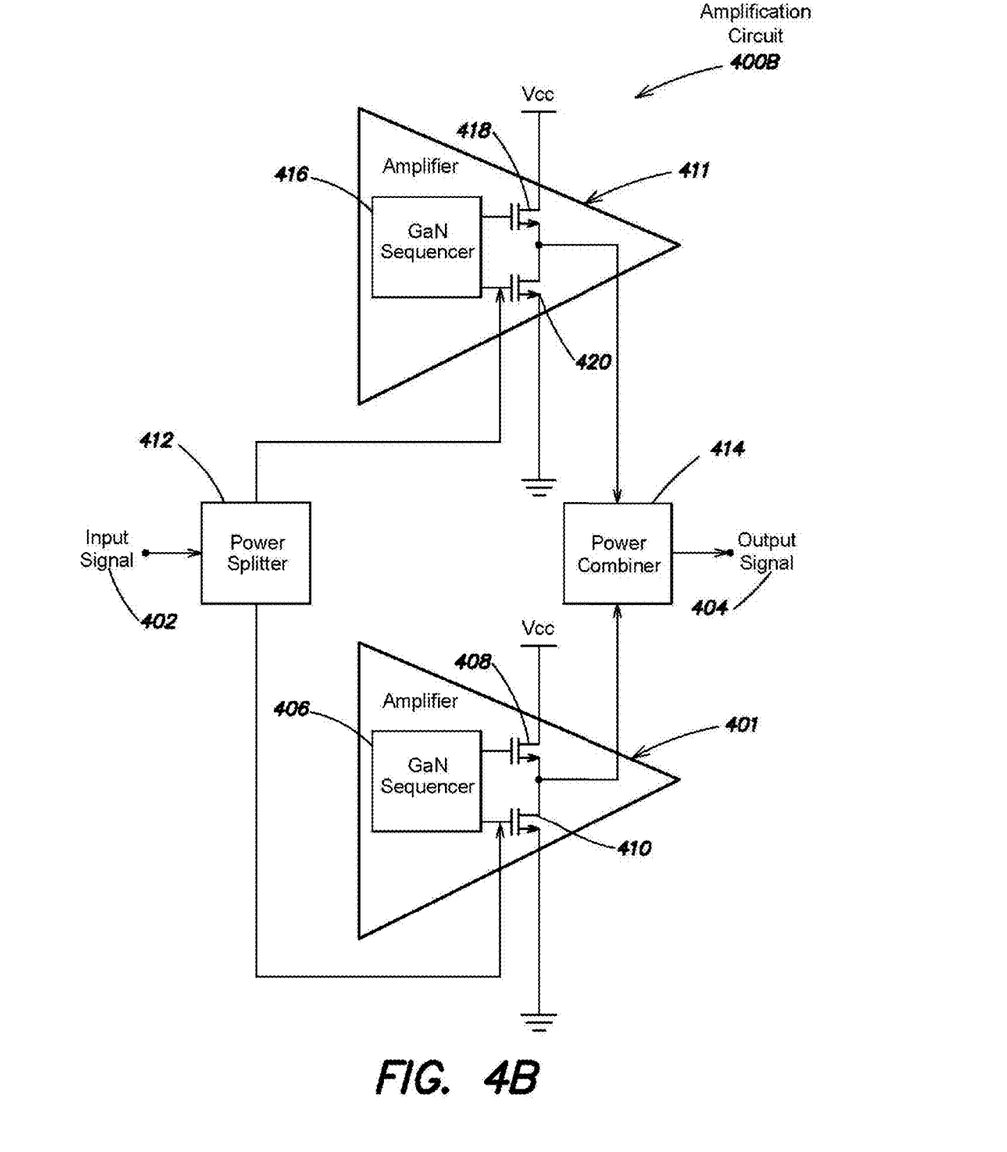

It should be appreciated that various alternations may be made to the amplification circuit 400A without departing from the scope of the present disclosure. For example, the amplification circuit 400A may include multiple amplifiers coupled in parallel such as in Doherty amplifiers. Such an example amplification circuit is shown in FIG. 4B by the amplification circuit 400B. The amplification circuit 400B adds a second amplifier 411, a power splitter 412, and a power combiner 414 relative to the amplification circuit 400A described above with reference to FIG. 4A.

The power splitter 412 receives the input signal 402 and splits the input signal 402 into two output signals and provides the output signals to the amplifiers 401 and 411. The output signals of the power splitter 412 may have a similar (or same) voltage waveform as the input signal 402 at a different power level. For example, each output signal of the power splitter 412 may have about half of the power of the input signal 402. It should be appreciated that the power splitter 412 may be implemented in any of a variety of fashions as appreciated by those of skill in the art.

The amplifiers 401 and 411 each amplify one of the two output signals from the power splitter 412. The amplifiers 401 and 411 may be tuned to amplify different parts of the received output signal from the power splitter 412. For example, the amplifier 411 may be configured as a carrier amplifier and amplify portions of the output signal from the power splitter 412 that fall within a power range. In this example, the amplifier 401 may be configured as a peaking amplifier and amplify portions of the output signal that are outside the power range of the carrier amplifier. Thereby, each of the amplifiers 401 and 411 may be biased to amplify different portions of the input signal 402.

The power combiner 414 receives the amplified signals from the amplifiers 401 and 411 and combines the received amplified signals to generate the output signal 404. It should be appreciated that the power combiner 414 may be implemented in any of a variety of fashions as appreciated by those of skill in the art.

In some embodiments, the amplifier 411 may have a similar construction to the amplifier 401. For example, the amplifier 411 may include a GaN sequence 416 coupled to the gate terminals of a GaN transistor 420 and a transistor 418. The transistor 418 and the GaN transistor 420 may be coupled in series between the supply voltage Vcc and the reference potential (e.g., ground).

Figure 4C:
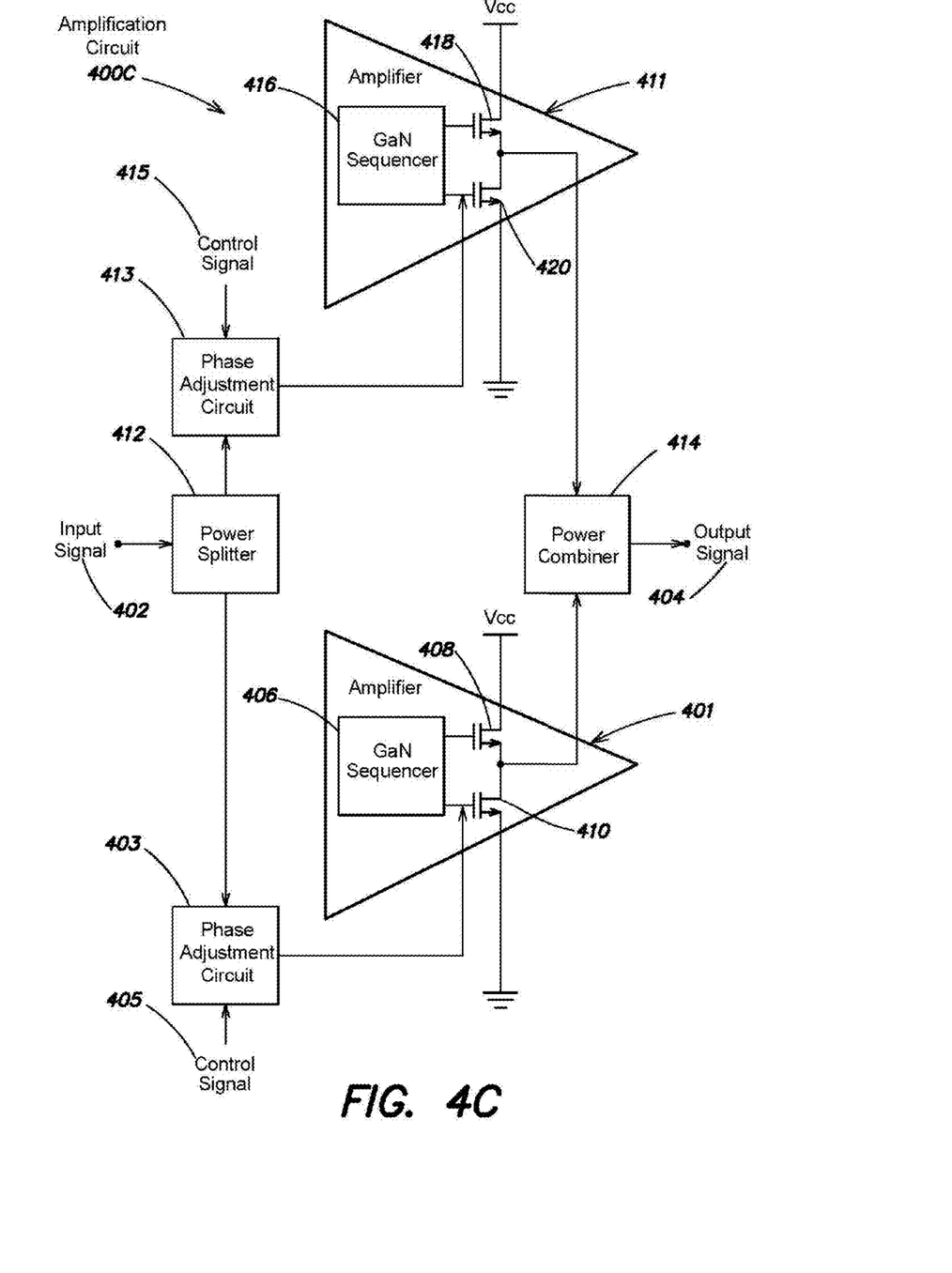

It should be appreciated that the amplification circuit 400B may be combined with the phase adjustment circuit 116 according to some embodiments. For example, the phase adjustment circuit 116 may be combined with the amplification circuit 400B to allow independent phase adjustment for each of the amplifiers in the set of parallel amplifiers. Such an example amplification circuit is shown in FIG. 4C by the amplification circuit 400C. The amplification circuit 400C adds a phase adjustment circuit 403 coupled between the power splitter 412 and the amplifier 401 in addition to a phase adjustment circuit 413 coupled between the power splitter 412 and the amplifier 411 relative to the amplification circuit 400B. The addition of the phase adjustment circuits 403 and 413 allows independent control of the phase of the signals received by the amplifiers 401 and 411. Thereby, the phase shift applied by the phase adjustment circuit 413 may be different than the phase adjustment applied by the phase adjustment circuit 403. The phase adjustment introduced by the phase adjustment circuits 403 and 413 may be controlled by control signals 405 and 415, respectively. The control signals 405 and 415 may be generated by, for example, controller 122 as described above with reference to FIG. 1.

Figure 5:
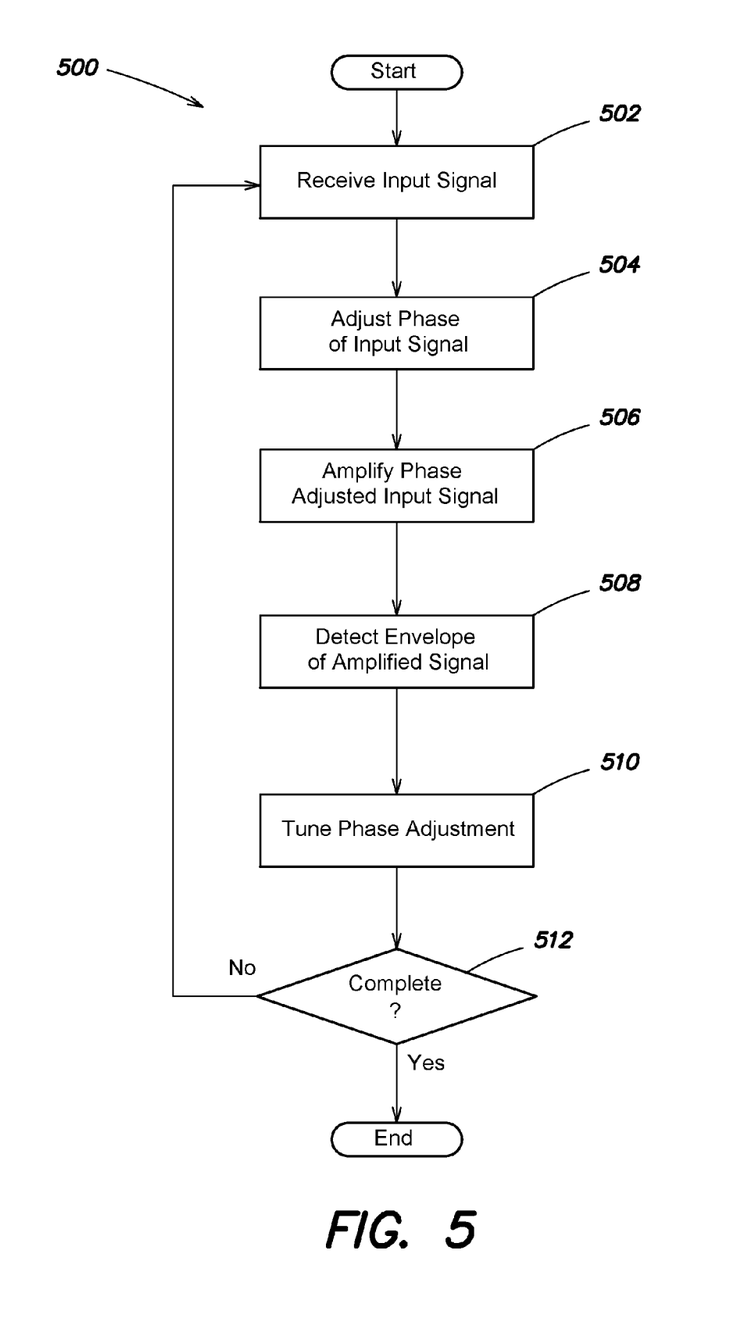
FIG. 5 shows an example method of wireless transmission, according to some embodiments.

As discussed above, various circuits may be designed to compensate for the phase error introduced by amplifiers employing GaN transistor(s) in communication systems. FIG. 5 illustrates an example wireless transmission process 500 that may be performed by a communication system to compensate for this phase error. The process 500 pre-distorts the input signal prior to applying the input signal to an amplifier that introduces phase distortion. Thereby, the resulting signal from the amplifier has a reduced phase error. For example, the resulting signal may have a near zero (or zero) phase error.

In act 502, the system receives an input signal. The input signal may be the signal that is to be wireless transmitted. For example, the input signal may include a modulated signal from a modulator.

In act 504, the system adjusts a phase of the input signal to compensate for a phase error to be introduced by an amplifier. For example, the system may adjust the phase of the input signal via a phase adjustment circuit as described above with reference to FIGS. 2 and 3. In this example, the system may apply a control signal to the phase adjustment circuit to control a magnitude of the phase shift that is introduced into the input signal.

In act 506, the system amplifies the phase adjusted input signal. The system may amplify the signal with an amplifier employing GaN transistor(s) that introduce the phase error into the output signal if not corrected. For example, the system may amplify the phase adjusted signal using any of the amplification circuits described above with reference to FIGS. 4A-4C. The phase pre-distortion performed in act 504 combined with the amplification in act 506 yields a resulting output signal with a reduced phase error.

In act 508, the system detects an envelope of the amplified signal. The system may detect the envelope of the amplified signal via, for example, an envelope detector.

In act 510, the system tunes the phase adjustment that is to be introduced into the input signal based on the envelope of the amplified signal. For example, the system may extract phase information from the envelope of the amplified signal and adjust an amplitude of the control signal applied to the phase adjustment circuit and/or adjust a resistance of a variable resistance in the phase adjustment circuit.

In act 512, the system determines whether the transmission is complete. If the transmission is complete, the process 500 ends. Otherwise, the system returns to act 502 to receive a new input signal and apply the phase adjustment determined in act 510.

The terms "approximately" and "about" may be used to mean within ±20% of a target dimension in some embodiments, within ±10% of a target dimension in some embodiments, within ±5% of a target dimension in some embodiments, and yet within ±2% of a target dimension in some embodiments. The terms "approximately" and "about" may include the target dimension.

The technology described herein may be embodied as a method, of which at least some acts have been described. The acts performed as part of the method may be ordered in any suitable way. Accordingly, embodiments may be constructed in which acts are performed in an order different than described, which may include performing some acts simultaneously, even though described as sequential acts in illustrative embodiments. Additionally, a method may include more acts than those described, in some embodiments, and fewer acts than those described in other embodiments.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A communication system comprising:
   a phase adjustment circuit configured to receive a first signal and generate a second signal by adjusting a phase of the first signal to compensate for a phase error subsequently introduced by a gallium nitride (GaN) transistor, the phase adjustment circuit including a coupler having a first port to receive the first signal, a second port to provide the second signal, a third port, and a fourth port, a first variable capacitance diode coupled between the third port and a reference potential, a second variable capacitance diode coupled between the fourth port and the reference potential, and an RC filter coupled to a cathode of the first variable capacitance diode and a cathode of the second variable capacitance diode;
   an amplification circuit including the GaN transistor, a second transistor coupled in series with the GaN transistor, and a GaN sequencer coupled to the GaN transistor and the second transistor and configured to sequence the GaN transistor by applying a bias voltage to the GaN transistor before turning on the second transistor, the amplification circuit being configured to receive the second signal, amplify the second signal to generate a third signal by applying the second signal to the GaN transistor, and provide the third signal to an antenna for wireless transmission;
   an envelope detector configured to receive the third signal and detect an envelope of the third signal; and
   a controller configured to receive the envelope of the third signal from the envelope detector and provide a control signal to the phase adjustment circuit based on the envelope of the third signal.

2. The communication system of claim 1, wherein the phase adjustment circuit is configured to compensate for a phase error introduced by trapping effects in the GaN transistor.

3. The communication system of claim 1, wherein the amplification circuit includes:
   a power splitter coupled to the phase adjustment circuit;
   a first amplifier coupled to the power splitter;
   a second amplifier coupled to the power splitter; and
   a power combiner coupled to the first amplifier and the second amplifier.

4. The communication system of claim 1, wherein the RC filter is a tunable RC filter and wherein the controller is further configured to tune the RC filter based on the envelope of the third signal.

5. The communication system of claim 1, wherein the phase adjustment circuit further includes a first inductance coupled between the cathode of the first variable capacitance diode and the RC filter and a second inductance coupled between the cathode of the second variable capacitance diode and the RC filter.

6. The communication system of claim 1, wherein the phase adjustment circuit further includes a first capacitance coupled between the cathode of the first variable capacitance diode and the third port and a second capacitance coupled between the cathode of the second variable capacitance diode and the fourth port.

7. The communication system of claim 1, wherein the phase adjustment circuit includes at least one variable resistance and wherein the controller is further configured to adjust a resistance of the at least one variable resistance based on the envelope of the third signal.

8. The communication system of claim 1, wherein the control signal includes a pulse and wherein an amplitude of the pulse controls a magnitude of the phase shift introduced by the phase adjustment circuit.

9. The communication system of claim 1, further comprising a modulator configured to receive a baseband signal and a carrier signal and generate the first signal by modulating the carrier signal based on the baseband signal.

10. A method of wirelessly transmitting a signal comprising:
   receiving an input signal;
   adjusting a phase of the input signal by a phase adjustment amount using a phase adjustment circuit to generate a phase adjusted signal and compensate for a phase error subsequently introduced by a gallium nitride (GaN) transistor, the phase adjustment circuit including a coupler having a first port to receive the input signal, a second port to provide the phase adjusted signal, a third port, and a fourth port, a first variable capacitance diode coupled between the third port and a reference potential, a second variable capacitance diode coupled between the fourth port and the reference potential, and an RC filter coupled to a cathode of the first variable capacitance diode and a cathode of the second variable capacitance diode;

sequencing the GAN transistor including applying a bias voltage to the GaN transistor before turning on a second transistor coupled in series with the GaN transistor;

amplifying the phase adjusted signal to generate an amplified signal including applying the phase adjusted input signal to the GaN transistor;

detecting an envelope of the amplified signal;

tuning the phase adjustment amount based on the envelope of the amplified signal; and wirelessly transmitting the amplified signal.

11. The method of claim 10, wherein adjusting the phase of the input signal includes adjusting the phase of the input signal to compensate for a phase error introduced by trapping effects in the GaN transistor.

12. The method of claim 10, wherein adjusting the phase of the input signal includes applying the input signal to a phase adjustment circuit and applying a control signal to the phase adjustment circuit.

13. The method of claim 12, wherein tuning the phase adjustment amount includes changing an amplitude of the control signal.

14. The method of claim 12, wherein tuning the phase adjustment amount includes changing a resistance of at least one variable resistance in the phase adjustment circuit.

15. The method of claim 12, wherein tuning the phase adjustment amount includes identifying a phase of the amplified signal based on the envelope of the amplified signal and tuning the phase adjustment amount based on the identified phase of the amplified signal.

16. The communication system of claim 1, wherein the amplification circuit includes a Doherty amplifier.

17. The communication system of claim 1, wherein the amplification circuit includes at least two amplifiers coupled in parallel.

18. A communication system comprising:

a phase adjustment circuit configured to receive a first signal and generate a second signal by adjusting a phase of the first signal to compensate for a phase error subsequently introduced by a gallium nitride (GaN) transistor, the phase adjustment circuit including a coupler having a first port to receive the first signal, a second port to provide the second signal, a third port, and a fourth port, a first variable capacitance diode coupled between the third port and a reference potential, a second variable capacitance diode coupled between the fourth port and the reference potential, and an RC filter coupled to a cathode of the first variable capacitance diode and a cathode of the second variable capacitance diode;

an amplification circuit including the GaN transistor and being configured to receive the second signal, amplify the second signal to generate a third signal by applying the second signal to the GaN transistor, and provide the third signal to an antenna for wireless transmission;

an envelope detector configured to receive the third signal and detect an envelope of the third signal; and a controller configured to receive the envelope of the third signal from the envelope detector and provide a control signal to the phase adjustment circuit based on the envelope of the third signal.

* * * * *